United States Patent [19]
Lee

[11] Patent Number: 6,099,100
[45] Date of Patent: Aug. 8, 2000

[54] CMOS DIGITAL LEVEL SHIFT CIRCUIT

[75] Inventor: Won Kee Lee, Kumi, Rep. of Korea

[73] Assignee: LG Semicon Co., Ltd., Choongcheongbuk-do, Rep. of Korea

[21] Appl. No.: 09/055,236

[22] Filed: Apr. 6, 1998

[30] Foreign Application Priority Data

Jul. 15, 1997 [KR] Rep. of Korea ................. 97-32777

[51] Int. Cl.[7] ............................................. A03K 19/0185
[52] U.S. Cl. ............................. 328/81; 326/68; 326/83
[58] Field of Search ............................. 326/63, 70, 71, 326/80, 81, 83, 86, 68

[56] References Cited

U.S. PATENT DOCUMENTS

| | | | |
|---|---|---|---|
| 4,978,870 | 12/1990 | Chen et al. | |
| 5,243,236 | 9/1993 | McDaniel | 326/81 |
| 5,406,141 | 4/1995 | Yero et al. | 326/68 |
| 5,510,731 | 4/1996 | Dingwall | 326/81 |
| 5,559,464 | 9/1996 | Orii et al. | 326/81 |
| 5,736,869 | 4/1998 | Wei | 326/81 |
| 5,821,800 | 10/1998 | Le et al. | 326/81 |
| 5,834,948 | 11/1998 | Yoshizaki et al. | 326/81 |

*Primary Examiner*—Michael Tokar
*Assistant Examiner*—Don Phu Le

[57] ABSTRACT

A CMOS (Complementary Metal Oxide Semiconductor) digital level shift circuit converts a first source voltage which ranges from Vcc to the ground, into a second source voltage which ranges from Vdd to the ground. The circuit includes an inverter and a latch circuit. The latch circuit includes a latch unit and a voltage distributor having a plurality of PMOS and NMOS transistors. The plurality of MOS transistors are serially connected in the voltage distributor, whereby the second source voltage which is higher than the channel breakdown voltages of the respective MOS transistors, is externally output.

20 Claims, 3 Drawing Sheets

CMOS DIGITAL LEVEL SHIFT CIRCUIT

BACKGROUND OF THE INVENTION

1. Field of the Invention

The present invention relates to a digital level shift circuit, and more particularly to an improved CMOS (Complementary Metal Oxide Semiconductor) digital level shift circuit capable of outputting a high level voltage using transistors having a low level channel breakdown voltage.

2. Description of the Background Art

FIG. 1 illustrates a conventional CMOS digital level shift circuit. As shown therein, an inverter 1 outputs a first source voltage Vcc in accordance with a logic state of an input signal Vin. The inverter 1 includes a PMOS transistor P1 and an NMOS transistor N1. The PMOS transistor P1 includes a source connected to the first source voltage Vcc, a gate connected the gate of NMOS transistor N1 for receiving the input signal Vin, and a drain connected the drain of NMOS transistor N1 through an output terminal OUT1. The source of the NMOS transistor N1 is connected to the ground voltage Vss.

A latch circuit 2 outputs a second source voltage Vdd in accordance with a logic state of the input signal Vin. The latch circuit 2 includes a pair of PMOS transistors P21, P22 with their sources connected the second source voltage Vdd. and a pair of NMOS transistors N21, N22 with their drains connected to the drains of the PMOS transistors P21, P22, respectively, and their sources connected the ground voltage Vss.

The gate of the NMOS transistor N21 is connected with the output terminal OUT1 of the inverter 1, the gate of the PMOS transistor P22 is connected to the drains of the PMOS and NMOS transistors P21, N21, and the gate of the PMOS transistor P21 is connected to an output terminal OUT2 and to the drains of the PMOS and NMOS transistors P22, N21.

Here, the level of the second source voltage Vdd is higher than that of the first source voltage Vcc.

The operation of the above-described conventional CMOS digital level shift circuit will now be described.

When the input signal Vin is in a low level, the PMOS transistor P1 in the inverter 1 is turned on and the NMOS transistor N1 is turned off, whereby the first source voltage Vcc is output to the output terminal OUT1. The NMOS transistor N21 in the latch circuit 2 is turned on by the first source voltage Vcc and the drain of the NMOS transistor N21 at node NO1 has the ground voltage level. At the same time, since the gate of the PMOS transistor P22 is connected to the node NO1, the transistor P22 is turned on so that the node NO2 has the voltage level of the second source voltage Vdd. The level of the second source voltage Vdd is output at the output terminal OUT2 of the latch circuit 2. The NMOS transistor N22 also receives the low level input signal Vin through its gate and is turned off.

When the input signal Vin is in a high level, the PMOS transistor P1 in the inverter 1 is turned off and the NMOS transistor N1 is turned on, whereby the ground voltage is output at the output terminal OUT1. This turns off the NMOS transistor N21 in the latch circuit 2. However, the NMOS transistor N22 is turned on as the high level input signal Vin is applied to its gate, whereby the ground voltage is output at the output terminal OUT2.

When the node NO2 is in the ground voltage level, the PMOS transistor P21 is turned on, so that the node NO1 obtains the second source voltage Vdd level. This turns off the PMOS transistor P22.

The conventional CMOS digital level shift circuit employs the first source voltage Vcc and the second source voltage Vdd having a higher voltage level than Vcc, so as to externally output the higher second source voltage Vdd to an external circuit (not shown) connected thereto.

In order for the conventional circuit function properly, however, the channel breakdown voltages of the two transistors N1, P1 in the inverter 1 need to be greater than the first source voltage Vcc, and the channel breakdown voltages of the four transistors N21, N22, P21, P22 in the latch circuit 2 need to be greater than the second source voltage Vdd. The level of the second source voltage Vdd which is output through the output terminal OUT2 of the latch circuit 2 should be confined below the channel breakdown voltage levels of the four transistors N21, N22, P21, P22 in the latch circuit 2. Otherwise, the transistors N21, N22, P21, P22 will rupture due to insulation.

Therefore, the conventional CMOS digital level shift circuit has a disadvantage in that it requires use of a transistor with a high channel breakdown voltage if a high level source voltage were to be output.

SUMMARY OF THE INVENTION

Accordingly, it is an object of the present invention to provide a CMOS digital level shift circuit capable of outputting a high level source voltage by use of transistors having low breakdown voltage.

To achieve the above-described and other objects, there is provided a CMOS digital level shift circuit according to the present invention which includes an inverter having transistors connected between a first source voltage and a ground voltage, and outputting the first source voltage in accordance with a logic state of an input signal; and a latch circuit outputting a second source voltage in accordance with logic states of the input signal and an output signal of the inverter, wherein the latch circuit includes a latch unit having first and second PMOS transistors with their sources connected to the second source voltage, and first and second NMOS transistors with their sources connected to the ground voltage, and a voltage distributor disposed between the first and second PMOS transistors and the first and second NMOS transistors and externally outputting the second source voltage or the ground voltage.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed descriptions.

Briefly described, the present invention is directed to a digital level shift circuit comprising: inverter means, connected between a first source voltage and a ground voltage, for outputting the first source voltage in accordance with an input signal; and latch means for outputting a second source voltage in accordance with the input signal and an output signal of the inverter means, wherein the latch means includes, a plurality of first type transistors connected to the second source voltage, at least two of the first type transistors being connected in series with each other, and a plurality of second type transistors connected to the ground voltage, at least two of the second type transistors being connected in series with each other.

BRIEF DESCRIPTION OF THE DRAWINGS

The present invention will become more clearly understood with reference to the accompanying drawings which are given only by way of illustration and thus are not limitative of the present invention, wherein.

DETAILED DESCRIPTION OF THE PREFERRED EMBODIMENTS

With reference to the accompanying drawings, the CMOS digital level shift circuit according to the present invention is described.

Figure 1:
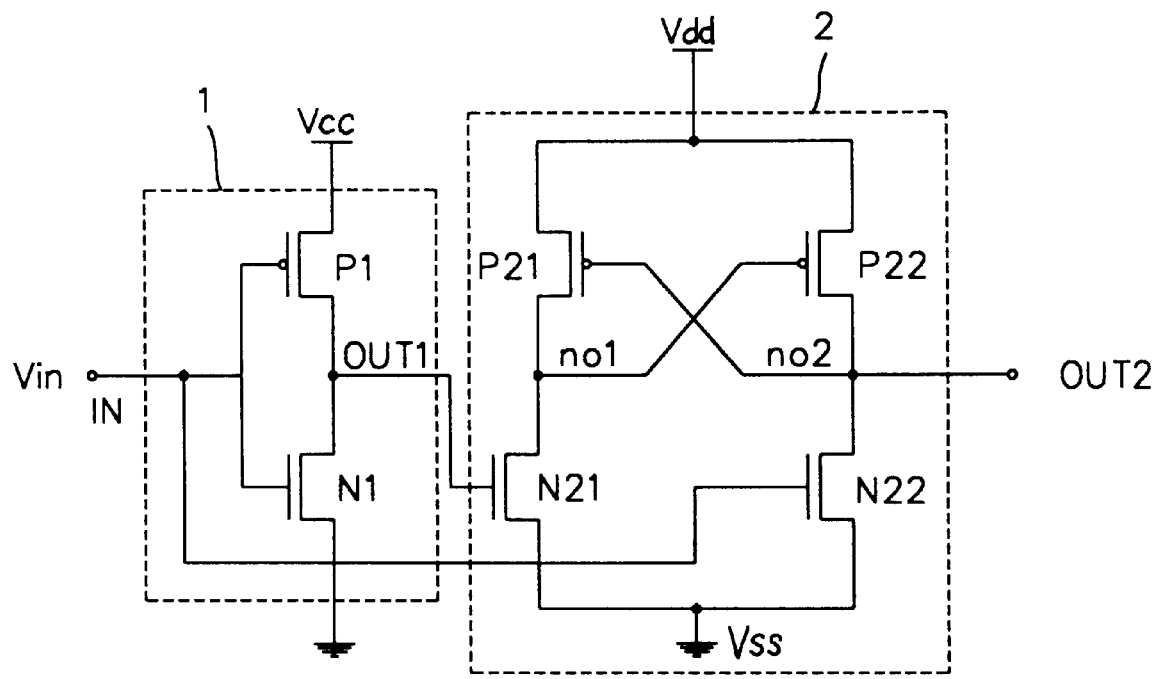
FIG. 1 is a circuit diagram of a conventional CMOS digital level shift circuit.
Figure 2:
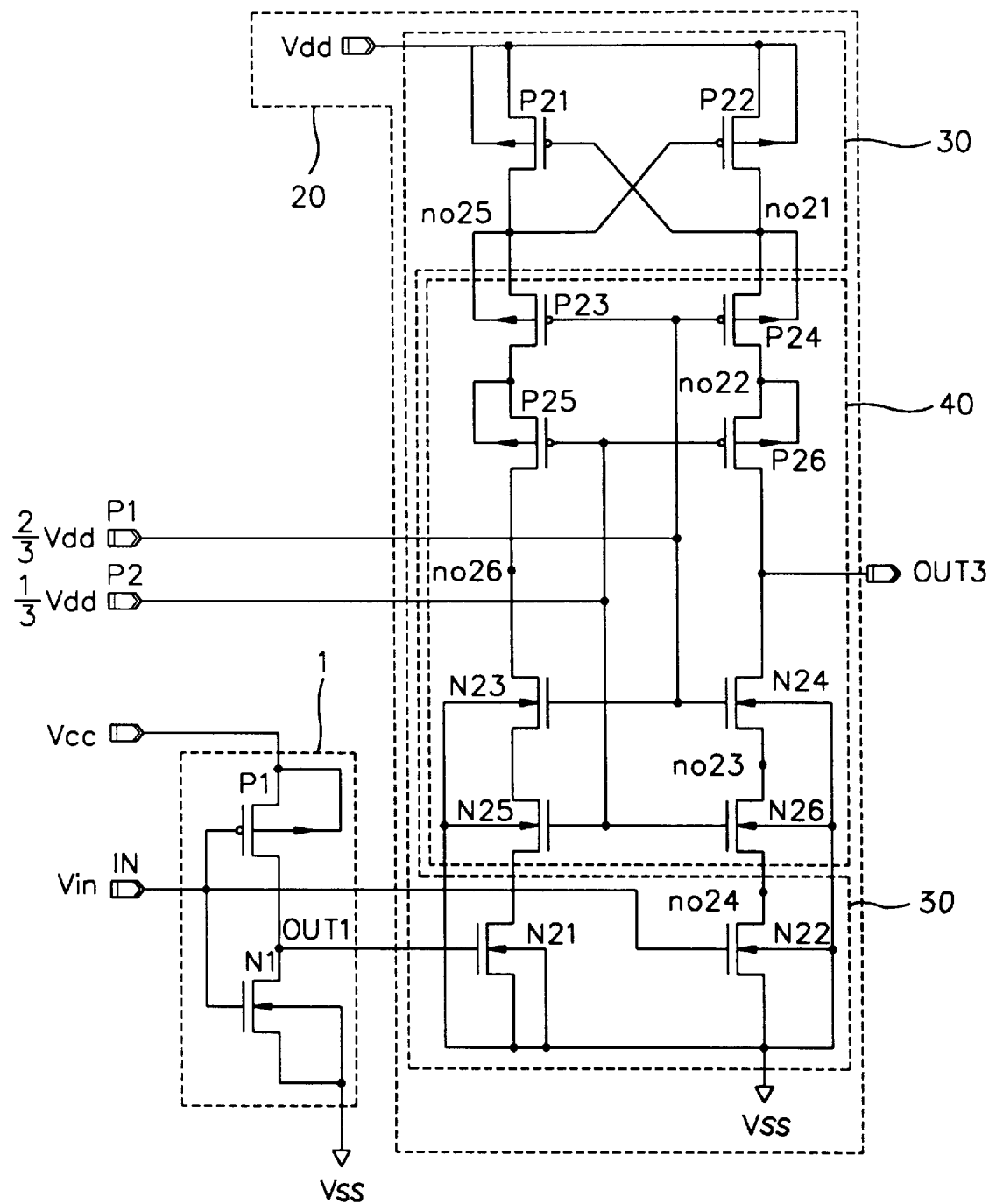
FIG. 2 is a circuit diagram of a CMOS digital level shift circuit according to an embodiments of the present invention.

FIG. 2 illustrates a CMOS digital level shift circuit according to the preferred embodiments of the present invention. As shown in FIG. 2, the CMOS circuit includes an inverter 1 and a latch circuit 20. The inverter 1 outputs a first source voltage Vcc according to the logic state of an input signal Vin and is identical to the inverter 1 in FIG. 1. The latch circuit 20 includes a latch unit 30 and a voltage distributor 40 and outputs a second source voltage Vdd in accordance with the logic state of a signal output at an output terminal OUT1 in the inverter 1.

The latch unit 30 includes first and second PMOS transistors P21, P22 with their sources connected to the second source voltage Vdd, and first and second NMOS transistors N21, N22 with their sources connected to the ground voltage Vss. The gate of the second PMOS transistor P22 is connected to the drain of the first PMOS transistor P21 at node NO25, and the gate of the first PMOS transistor P21 is connected to the drain of the second PMOS transistor P22 at node NO21.

The voltage distributor 40 is disposed between the first and second PMOS transistors P21, P22 and the first and second NMOS transistors N21, N22. The distributor 40 distributes the second source voltage Vdd and externally outputs the second source voltage Vdd or the ground voltage Vss through the latch unit 30, In the voltage distributor 40, third and fifth PMOS transistors P23, P25, and third and fifth NMOS transistors N23, N25 are serially connected between the first PMOS transistor P21 and the first NMOS transistor N21. Fourth and sixth PMOS transistors P24, P26, and fourth and sixth NMOS transistors N24, N26 are serially connected between the second PMOS transistor P22 and the second NMOS transistor N22. The gates of the third and fourth PMOS transistors P23, P24 and the third and fourth NMOS transistors N23, N24 are connected in common, to receive two-thirds (⅔) of the second source voltage Vdd through the first input terminal P1. The gates of the fifth and sixth PMOS transistors P25, P26 and the fifth and sixth NMOS transistors N25, N26 are connected in common, to receive one-third (⅓) of the second source voltage Vdd through the second input terminal P2. Here, the level of the second source voltage Vdd is higher than that of the first source voltage Vcc.

The operation of the CMOS digital level shift circuit according to the preferred embodiments of the present invention will now be described.

Figure 3:
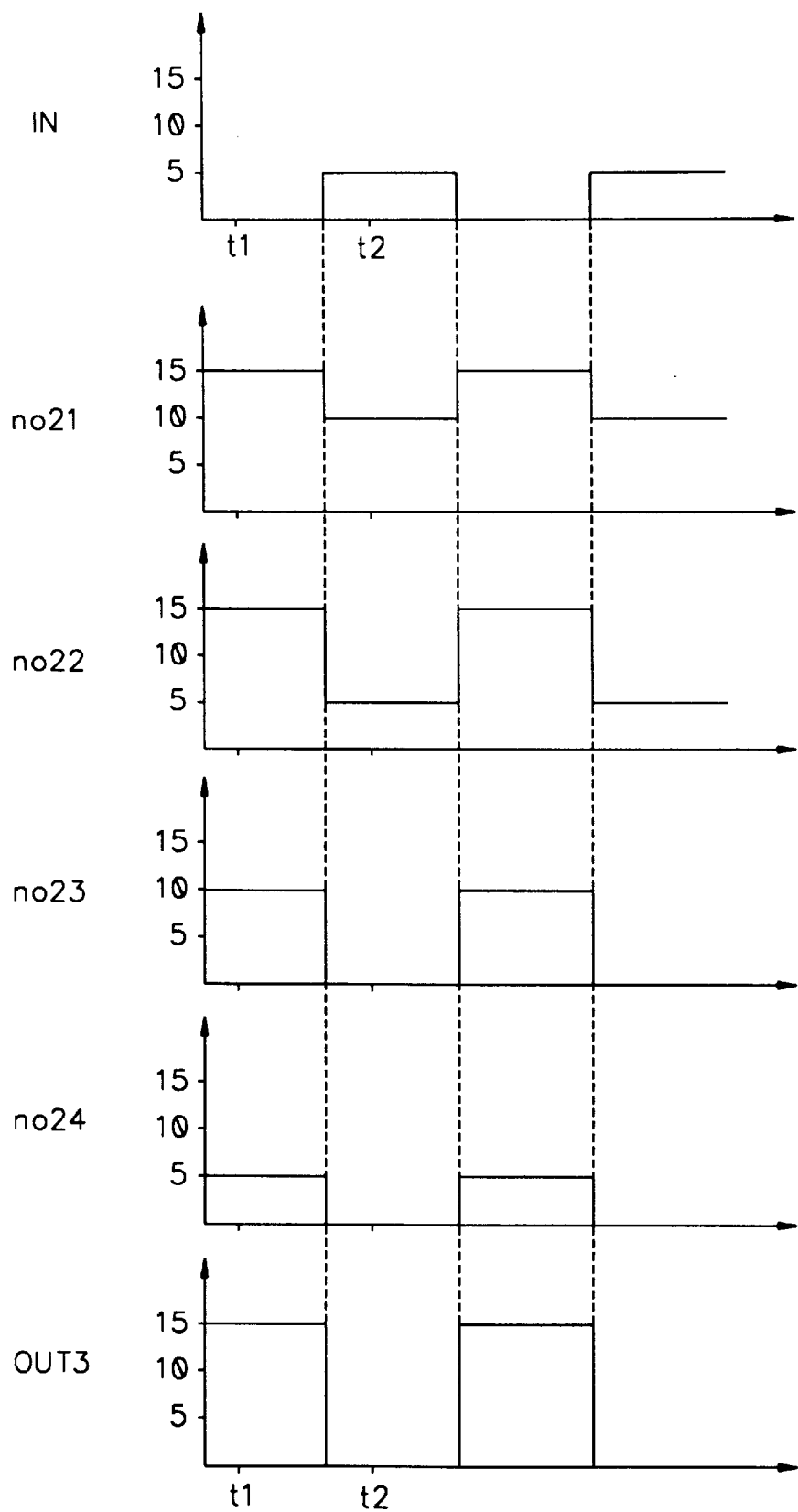
FIG. 3 is a multiple graph illustrating voltage waves at nodes of the circuit of FIG. 2.

FIG. 3 shows a multiple graph illustrating voltage waves at the nodes of the circuit shown in FIG. 2, assuming that the second source voltage Vdd is 15 volts and the first source voltage Vcc is 5 volts, so that two-thirds (⅔) of the second source voltage Vdd (i.e., 10 volts) is applied to the first input terminal P1, and one-third (⅓) of the second source voltage Vdd (i.e., 5 volts) is applied to the second input terminal P2.

At the timing point t1 in FIG. 3 when a low level input signal Vin is applied to the input terminal IN, the PMOS transistor P1 in the inverter 1 is turned on and the NMOS transistor N1 is turned off, whereby the first source voltage Vcc is output to the output terminal OUT1.

Consequently, the first NMOS transistor N21 of the latch unit 30 is turned on by the first source voltage Vcc output from the output terminal OUT1, and the second NMOS transistor N22 is turned off by the low level input signal Vin.

The fifth NMOS transistor N25 in the voltage distributor 40 is turned on by the voltage (⅓ Vdd) output from the second input terminal P2, and the third NMOS transistor N23 is turned on by the voltage (⅔ Vdd) output from the first input terminal P1, whereby the node NO26 has the ground voltage Vss.

At this time, the second source voltage Vdd of 15 volts is applied the source of the PMOS transistor P21. The PMOS transistor P21 and the two PMOS transistors P23, P25 are serially connected to each other, and a voltage of 10V is applied to the first input terminal P1. Therefore, the voltage applied to the drain of the PMOS transistor P21, i.e. the voltage at the node NO25, becomes about 10 volts. Then the voltage of 10 volts is applied to the gate of the second PMOS transistor P22 connected in parallel with the PMOS transistor P21, whereby the PMOS transistor P22 is turned on. As a result, the voltage at the node NO21 becomes 15 volts, and the fourth and sixth PMOS transistors P24, P26 serially connected to the PMOS transistor P22 are turned on. Accordingly, the second source voltage Vdd of 15 volts is output through the output terminal OUT3.

Here, because the fourth and sixth NMOS transistors N24, N26, and the second NMOS transistor N22 are serially connected to each other between the output terminal OUT3 and the ground, a voltage of 5 volts is applied to the respective NMOS transistors. That is, as shown in FIG. 3, the node NO23 voltage becomes 10 volts, and the node NO24 voltage becomes 5 volts.

At the timing point t2 in FIG. 3 when the input signal Vin is in a high level, the PMOS transistor P1 in the inverter 1 is turned off and the NMOS transistor N1 is turned on, whereby the output terminal OUT1 is connected to the ground.

The first NMOS transistor N21 in the latch unit 30 is turned off and the second NMOS transistor N22 is turned on in accordance with the high level input signal Vin from the input terminal IN.

The sixth NMOS transistor N26 is turned on by the voltage (⅓ Vdd) output from the second input terminal P2, and the fourth NMOS transistor N24 is turned on by the voltage (⅔ Vdd) output from the first input terminal P1, whereby the output terminal OUT3 is connected to the ground.

At this time, the second PMOS transistor P22 and the fourth and sixth PMOS transistors P24, P26 are serially connected to each other between the second source voltage Vdd and the output terminal OUT3, so that a voltage of 5 volts is applied to the respective PMOS transistors. That is, as shown in FIG. 3, the voltage at the node NO21 becomes 10 volts and the voltage of the node NO22 becomes 5 volts.

In the CMOS digital level shift circuit according to the present invention, three PMOS transistors are serially connected between the second source voltage Vdd and the output terminal OUT3, three NMOS transistors are serially connected between the output terminal OUT3 and the ground voltage Vss, and voltages of ⅔ Vdd and ⅓ Vdd are applied to the respective gates of these transistors provided in the voltage distributor 40. Therefore, the voltage applied to the respective MOS transistors is restricted to below 5 volts, whereby the second source voltage Vdd of 15 volts which is three times larger than the channel breakdown voltage, is externally output by the use of a transistor having a channel breakdown voltage of 5 volts.

Additional MOS transistors can be inserted between the source voltage and the output terminal and between the output terminal and the ground to obtain a higher source voltage output. For example, in order to output a source voltage which is four times larger than the breakdown voltage by the use of the circuit according to the present invention, additional PMOS and NMOS transistors are serially connected between the fifth PMOS transistor P25 and the third NMOS transistor N23 in the voltage distributor 40 in FIG. 2, and additional PMOS and NMOS transistors are serially connected between the sixth PMOS transistor P26 and the fourth NMOS transistor N24. Voltages of ¾ Vdd, 2/4 Vdd and ¼ Vdd are applied to corresponding ones of the respective MOS transistors in the voltage distributor 40.

In the CMOS digital level shift circuit according to the present invention, a plurality of PMOS transistors are serially connected between a source voltage and an output terminal in consideration of respective channel breakdown voltages of the MOS transistors in the voltage distributor, and a plurality of NMOS transistors which correspond to the PMOS transistors in number are serially connected between the output terminal and the ground. The voltage that is to be applied to the respective gates of the MOS transistors is determined considering the breakdown voltage of the MOS transistors, whereby a high source voltage is externally output by the use of a plurality of transistors having low channel breakdown voltages.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A CMOS (Complementary Metal Oxide Semiconductor) digital level shift circuit, comprising:
   an inverter including transistors connected between a first source voltage and a ground voltage, and outputting one of the first source voltage and the ground voltage in accordance with a logic state of an input signal; and
   a latch circuit outputting one of a second source voltage and the ground voltage in accordance with logic states of the input signal and an output signal of the inverter, wherein the latch circuit includes,
      a latch unit having first and second PMOS transistor with their sources connected to the second source voltage, and first and second NMOS transistors with their sources connected to the ground voltage, and
      a voltage distributor disposed between the first and second PMOS transistors and the first and second NMOS transistors and externally outputting one of the second source voltage and the ground voltage, the voltage distributor including,
         third and fifth PMOS transistors and third and fifth NMOS transistors serially connected between the first PMOS transistor and the first NMOS transistor, and
         fourth and sixth PMOS transistors and fourth and sixth NMOS transistors serially connected between the second PMOS transistor and the second NMOS transistor.

2. The digital level shift circuit of claim 1, wherein a gate of the second PMOS transistor is connected to a drain of the first PMOS transistor, and a gate of the first PMOS transistor is connected to a drain of the second PMOS transistor.

3. The digital level shift circuit of claim 1, wherein the inverter includes a PMOS transistor and an NMOS transistor serially connected between the first source voltage and the ground voltage.

4. The digital level shift circuit of claim 1, wherein the latch circuit outputs the second source voltage which is three times larger than the channel breakdown voltage of one of the first through sixth PMOS and NMOS transistors.

5. The digital level shift circuit of claim 1, wherein the third and fourth PMOS transistors and the third and fourth NMOS transistors are connected in common with their gates receiving two-thirds (⅔) of the second source voltage.

6. The digital level shift circuit of claim 1, wherein the fifth and sixth PMOS transistors and the fifth and sixth NMOS transistors are connected in common with their gates receiving one-third (⅓) of the second source voltage.

7. The digital level shift circuit of claim 1, wherein the level of the second source voltage is higher than that of the first source voltage.

8. A digital level shift circuit comprising:
   inverter means, connected between a first source voltage and a ground voltage, for outputting one of the first source voltage and the ground voltage in accordance with an input signal; and
   latch means for outputting one of a second source voltage and the ground voltage in accordance with the input signal and an output signal of the inverter means, wherein the latch means includes,
      first and second transistors of a first type with their sources connected to the second source voltage, and third and fifth transistors of the first type serially connected to the first transistor of the first type, and
      first and second transistors of a second type with their sources connected to the ground voltage, and third and fifth transistors of the second type serially connected to the first transistor of the second type.

9. The digital level shift circuit of claim 8, wherein the latch means outputs the second source voltage which is four times higher than the channel breakdown voltage of one of the first type and second type transistors.

10. The digital level shift circuit of claim 8, wherein the inverter means includes a PMOS transistor and an NMOS transistor serially connected between the first source voltage and the ground voltage.

11. The digital level shift circuit of claim 8, wherein the first type transistors and the second type transistors in the latch means are PMOS transistors and NMOS transistors, respectively.

12. The digital level shift circuit of claim 8, wherein the level of the second source voltage is higher than that of the first source voltage.

13. The digital level shift circuit of claim 8, wherein the latch means outputs the second source voltage which is three times higher than the channel breakdown voltage of one of the first type and second type transistors.

14. The digital level shift circuit of claim 8 further including:
   fourth and sixth transistors of the first type serially connected to the second transistor of the first type; and fourth and sixth transistors of the second type serially connected to the second transistor of the second type.

15. The digital level shift level circuit of claim 14, wherein the third and fourth transistors of the first type and the third and fourth transistors of the second type are connected in common with their gates receiving a first predetermined voltage.

16. The digital level shift circuit of claim 15, wherein the first predetermined voltage equals two-thirds (⅔) of the second source voltage.

17. The digital level shift level circuit of claim 14, wherein the fifth and sixth transistors of the first type and the fifth and sixth transistors of the second type are connected in common with their gates receiving a second predetermined voltage.

18. The digital level shift circuit of claim 17, wherein the second predetermined voltage equals one-third (⅓) of the second source voltage.

19. The digital level shift level circuit of claim 15, wherein the first type transistors are PMOS transistors and the second type transistors are NMOS transistors.

20. The digital level shift level circuit of claim 17, wherein the first type transistors are PMOS transistors and the second type transistors are NMOS transistors.

* * * * *